United States Patent [19]

Arai et al.

[11] Patent Number: 5,164,034
[45] Date of Patent: Nov. 17, 1992

[54] APPARATUS AND METHOD FOR PROCESSING SUBSTRATE

[75] Inventors: Izumi Arai, Yokohama; Yoshifumi Tahara, Yamato; Yoshio Ishikawa, Inagi, all of Japan

[73] Assignee: Tokyo Electron Limited, Tokyo, Japan

[21] Appl. No.: 762,087

[22] Filed: Sep. 19, 1991

[30] Foreign Application Priority Data

Sep. 8, 1989 [JP] Japan .................................. 1-233341

[51] Int. Cl.⁵ .......................................... H01L 21/00
[52] U.S. Cl. .................................. 156/345; 118/723; 156/643; 156/659.1
[58] Field of Search ............... 156/345, 643, 659.1; 118/723; 204/298.25

[56] References Cited

U.S. PATENT DOCUMENTS

| | | | |
|---|---|---|---|
| 4,261,806 | 4/1981 | Asai et al. | 204/165 |
| 4,555,303 | 11/1985 | Legge et al. | 156/643 |
| 4,563,240 | 1/1986 | Shibata et al. | 156/345 |
| 4,657,618 | 4/1987 | Spencer et al. | 156/345 |
| 4,664,747 | 5/1987 | Sekiguchi et al. | 156/643 |
| 4,689,112 | 8/1987 | Bersin | 156/643 |
| 4,810,935 | 3/1989 | Boswell | 315/111.21 |
| 4,818,326 | 4/1989 | Liu et al. | 204/298.25 |
| 4,838,978 | 6/1989 | Sekine et al. | 156/345 |
| 4,842,680 | 6/1989 | Davis et al. | 156/345 |
| 4,885,047 | 12/1989 | Ury et al. | 156/643 |
| 4,891,087 | 1/1990 | Davis et al. | 156/345 |
| 4,908,095 | 3/1990 | Kagatsume et al. | 156/345 |
| 4,931,135 | 6/1990 | Horiuchi et al. | 156/345 |
| 4,956,043 | 9/1990 | Kanetomo et al. | 204/298.31 |
| 5,002,794 | 3/1991 | Ratner et al. | 427/40 |

FOREIGN PATENT DOCUMENTS

| | | |
|---|---|---|
| 0060917 | 9/1982 | European Pat. Off. . |
| 0264945 | 4/1988 | European Pat. Off. . |
| 57-99743 | 6/1982 | Japan .................................. 156/345 |
| 60-052013 | 3/1985 | Japan . |
| 62-090924 | 4/1987 | Japan . |
| 55034229 | 8/1987 | Japan . |

*Primary Examiner*—Brian E. Hearn
*Assistant Examiner*—George A. Goudreau
*Attorney, Agent, or Firm*—Oblon, Spivak, McClelland, Maier & Neustadt

[57] ABSTRACT

A substrate processing apparatus comprising a housing section for housing substrates to be processed, a first chamber for performing anisotropic etching treatment, conveyor means for conveying the substrates from the housing section to the first chamber, and a second chamber for performing at least one of isotropic etching treatment and ashing treatment with respect to a substrate which has been subjected to the anisotropic etching treatment in the first chamber. And a method of processing substrates, comprising the steps of performing anisotropic etching treatment in a first chamber with respect to the substrates, and performing at least one of isotropic etching treatment and ashing treatment in a second chamber with respect to the substrates which have been subjected to the anisotropic etching treatment in the first chamber and have been kept unexposed to the atmosphere, the isotropic etching treatment and the ashing treatment being performed simultaneously or in succession.

11 Claims, 5 Drawing Sheets

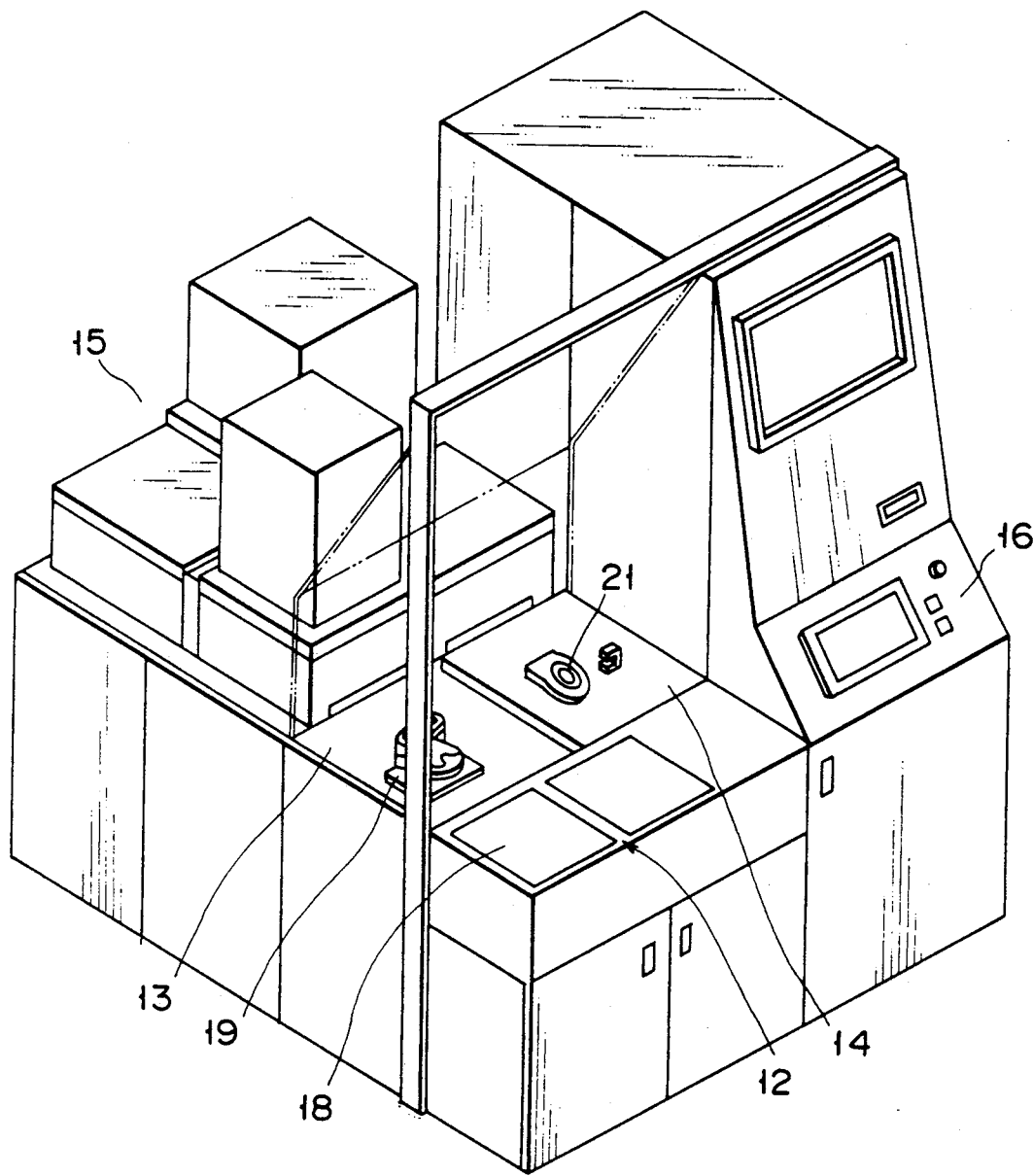
F I G. 2

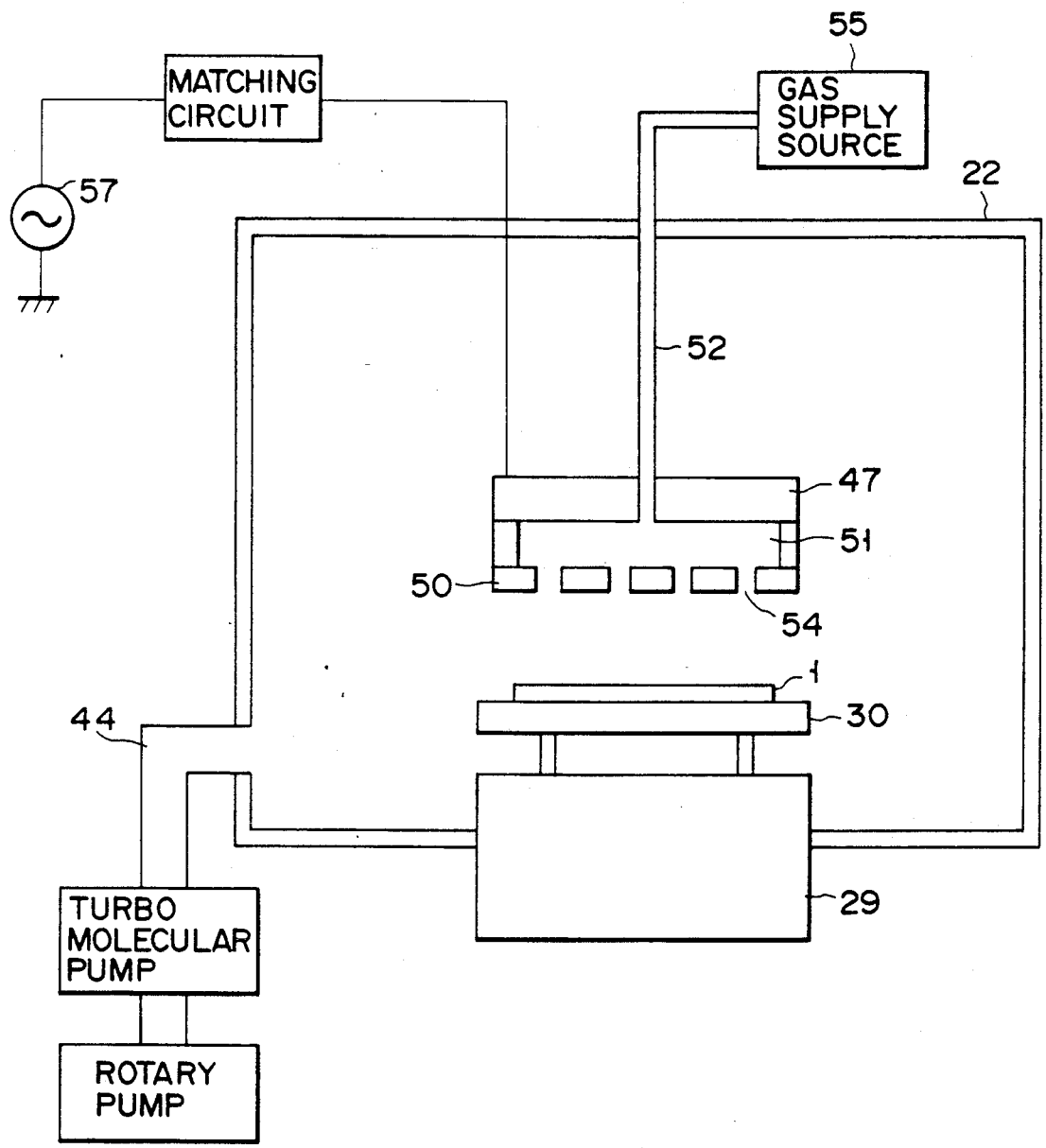
F I G. 4

APPARATUS AND METHOD FOR PROCESSING SUBSTRATE

This application is a continuation of application Ser. No. 07/578,399, filed on Sep. 7, 1990, now abandoned.

BACKGROUND OF THE INVENTION

1. Field of the Invention

The present invention relates to an apparatus and method for processing substrates.

2. Description of the Related Art

The micro-pattern of a semiconductor integrated circuit is formed by etching a base film formed on a semiconductor wafer while using an organic high-molecular photoresist film obtained by exposure and development as a mask. The photoresist film used as the mask is removed from the surface of the semiconductor wafer after the etching process. The plasma etching apparatus can be mentioned as intending to carry out the etching process and the ashing apparatus can also be mentioned as intending to remove the photoresist film from the semiconductor wafer.

In the case of ultra-micro etching process, anisotropic etching is carried out at first and the isotropic etching is then carried out to remove those damages which are left on the surface of the semiconductor wafer by the ions of the anisotropic etching (see Page 75, Japanese Edition of Solid State Technology Published in March, 1985).

Conventionally, each of the anisotropic and the isotropic etching process and the ashing process was carried out using its own apparatus separated. The semiconductor wafer was carried in and out of each of these apparatuses while being carried among those sections at which the processes were carried out. However, the semiconductor wafer is contacted with atmosphere even when it is treated in a clean room, and oxide film is formed on the semiconductor wafer, furthermore, fine dust, impurities and moisture present in the atmosphere adhere to the treating surface of it. This caused the pattern on the substrate to have flaws. In addition, this made it difficult for the processes to be reproduced. When the semiconductor wafer is contacted with atmosphere while being carried from the section for the metal etching process to the other section for the resist etching process particularly in the case of the metal etching process, the residue of etching gas of the chlorine group contained in a micro-amount on the semiconductor wafer reacts with moisture in atmosphere to corrode the metal layer on the semiconductor wafer. Therefore, the semiconductor wafer could not be carried to a section for the next process unless the corroded metal layer was removed from the semiconductor wafer.

In order to solve this problem, apparatuses each provided with plural processing chambers and a passage shielded from atmosphere have been proposed so as to transport the semiconductor wafer between these chambers, as disclosed in Japanese Patent Disclosures Sho 62-69619 and 63-39676. However, each of these apparatuses is only a combination of those processing chambers each of which is used only to carry out one process. When the apparatus is made suitable for carrying out the recent processes, therefore, it becomes complicated and large-sized.

SUMMARY OF THE INVENTION

The object of the present invention is therefore to provide an apparatus and a method for processing substrates and capable of efficiently applying processes such as etching and ashing to the substrates while keeping the substrates not affected by any of fine dust, impurities and moisture.

This object of the present invention can be achieved by a substrate processing apparatus comprising a housing section for housing substrates to be processed; a first chamber for performing anisotropic etching treatment; conveyor means for conveying the substrates from the housing section to the first chamber; and a second chamber for performing at least one of isotropic etching treatment and ashing treatment with respect to a substrate which has been subjected to the anisotropic etching treatment in the first chamber.

The object of the present invention can also be achieved by a method of processing substrates comprising the steps of performing anisotropic etching treatment in a first chamber with respect to the substrates; and performing at least one of isotropic etching treatment and ashing treatment in a second chamber with respect to the substrates which have been subjected to the anisotropic etching treatment in the first chamber and have been kept unexposed to the atmosphere, the isotropic etching treatment and the ashing treatment being performed simultaneously or in succession.

According to a substrate processing apparatus of the present invention, at least one of plural processing chambers includes isotropic plasma etching and resist ashing systems. This enables another chamber to have the anisotropic etching system. The etching process and the resist ashing process which follows the etching process can be therefore applied to a semiconductor wafer in at least two processing chambers without exposing the wafer to atmosphere. As the result, the productivity of wafers processed can be enhanced and the apparatus can be made simpler and smaller-sized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 2 is a perspective view showing an example of the substrate processing apparatus according to the present invention;

FIG. 4 is intended to explain how a first processing chamber shown in FIG. 3 is arranged.

DETAILED DESCRIPTION OF THE PREFERRED EMBODIMENT

An example of the substrate processing apparatus according to the present invention which is suitable for producing semiconductor devices will be described in detail with reference to the accompanying drawings. Etching and ashing processes are carried out in this order in the course of producing the semiconductor devices.

Figure 1A:
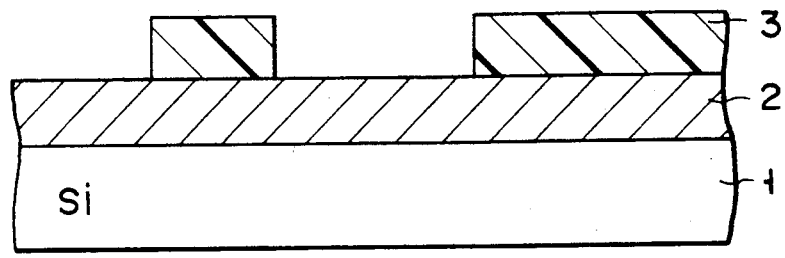
FIGS. 1A through 1D are intended to explain the main portion of processes of manufacturing semiconductor devices.

As shown in FIG. 1A, a mask layer 2 is formed on a semiconductor wafer 1 which is to be processed. A resist film 3 having a predetermined pattern is then placed on the mask layer 2.

Figure 1B:
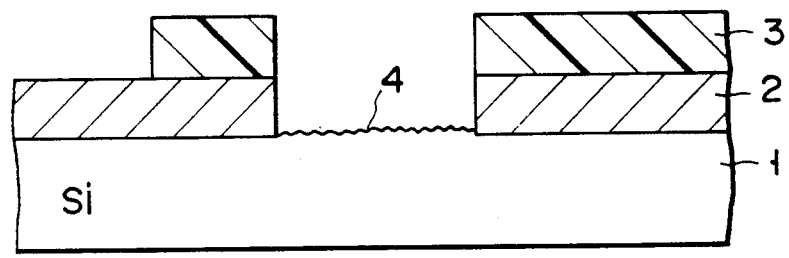

As shown in FIG. 1B, anisotropy etching which is higher in process speed is applied to the exposed mask layer 2, using the resist film 3 as a mask. When the anisotropy etching is carried out, damaged portions 4 caused by impact of directional ions and the like are formed on the exposed surface of the semiconductor wafer 1.

Figure 1C:
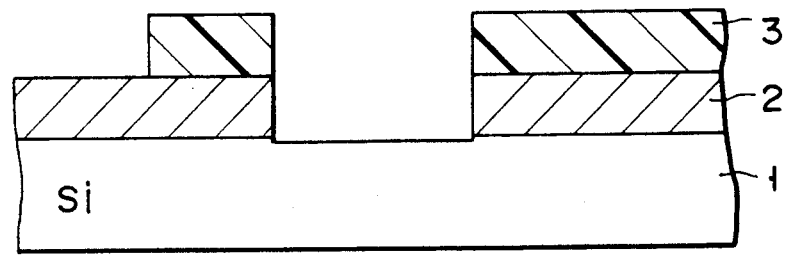

As shown in FIG. 1C, isotropic etching is applied to the semiconductor wafer 1, using the resist film 3 and the patterned mask layer 2 as masks, to thereby eliminate the damaged portions 4.

Figure 1D:
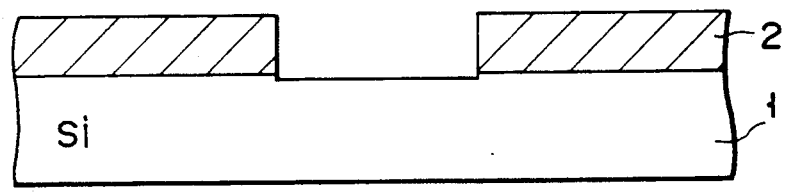

As shown in FIG. 1D, the resist film 3 is then removed from the mask layer 2 by ashing process.

Figure 3:
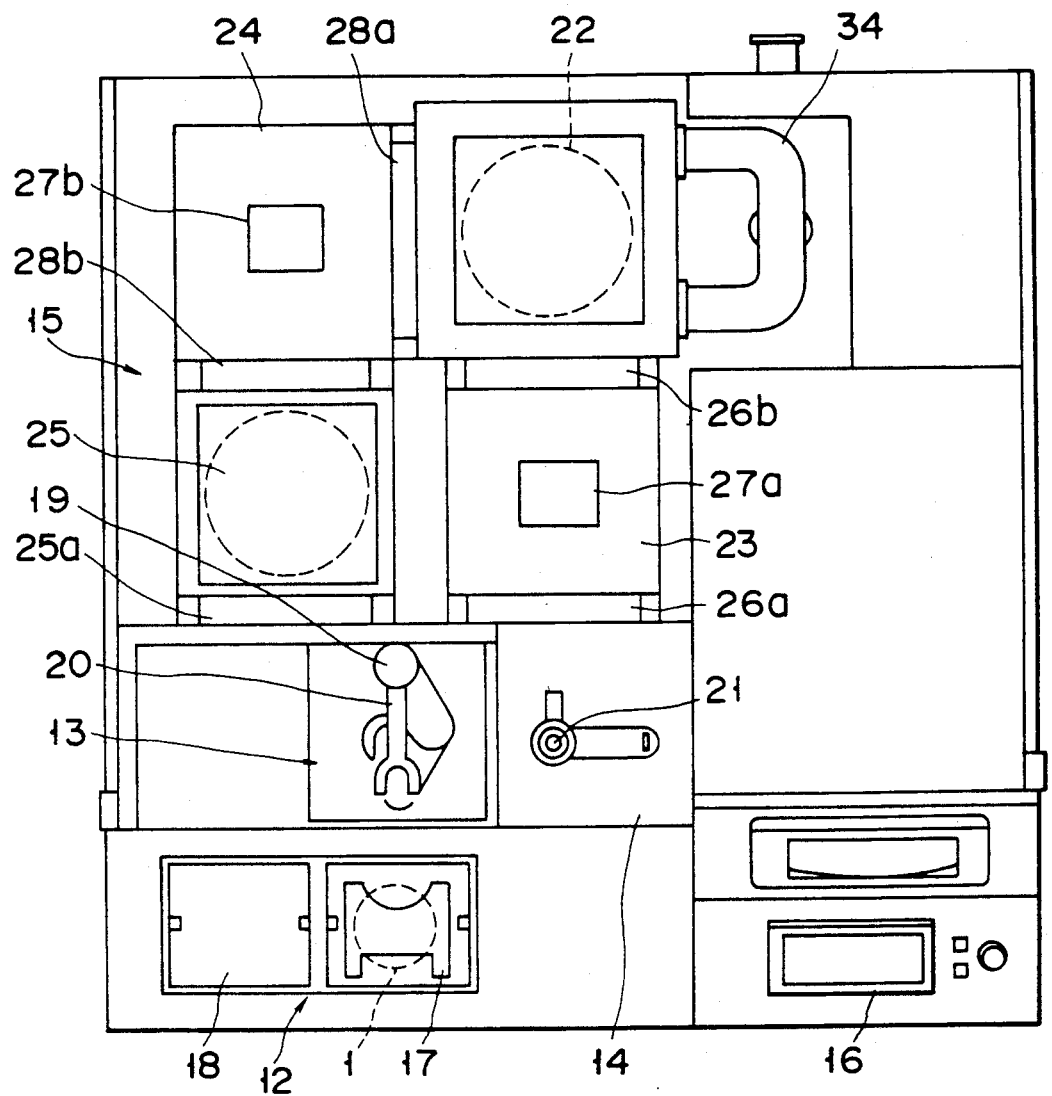
FIG. 3 is a plan showing the substrate processing apparatus.

FIG. 2 is a perspective view showing an example of the substrate processing apparatus intended to carry out the etching and ashing processes, and FIG. 3 is a plan showing the substrate processing apparatus. Reference numeral 12 denotes a section for housing semiconductor wafers 1 to be processed. A section 13 for carrying the semiconductor wafer 1 out of the wafer housing section 12 is located adjacent to the wafer housing section 12. An alignment section 14 for positioning the semiconductor wafer 1 thus carried is located adjacent to the wafer carrying section 13. These wafer housing, carrying and aligning sections 12, 13 and 14 form a loader-/unloader system. A section 15 for applying etching and ashing processes to the semiconductor wafer 1 which has been aligned at the alignment section 14 is located adjacent to the loader/unloader system. Each of these sections is operated and monitored by an operating section 16.

The wafer housing, carrying and aligning sections 12, 13 and 14 which form the loader/unloader system will be described in more detail.

A cassette mount 18 is freely moved up and down by a lift (not shown) in the wafer housing section 12. A wafer cassette 17 is mounted on the cassette mount 18. The wafer cassette 17 houses 25 sheets of the semiconductor wafers 1, for example, in such a way that they are stacked in their thickness direction with a certain interval interposed between them. It is preferable that the lift is located under the cassette mount 18 because they can be left dustproof.

A multi-joint robot 19 is arranged at the section 13 to carry the semiconductor wafer 1 among the wafer housing, aligning and processing sections 12, 14 and 15.

The multi-joint robot 19 is provided with an arm 20 which has a holder system or vacuum suction system. The arm 20 is made of ceramics or quartz so as to prevent the semiconductor wafer 1 from being contaminated with heavy metal. The multi-joint robot 19 can freely rotate round a point and move in horizontal and axial directions. A vacuum chuck 21 is arranged at the alignment section 14 where the semiconductor wafer 1 carried from the section 13 is positioned or aligned.

The vacuum chuck 21 comprises a disk-like inner chuck and a ring-shaped outer chuck located outside the inner chuck and separated from it by a certain interval. The inner chuck can rotate round its center and move up and down along its center. The outer chuck can move in horizontal and axial directions. The inner chuck is provided with a sensor movable to the center of the inner chuck to detect the outer circumferential rim of the wafer 1. The sensor is of the transmission type, for example.

The semiconductor wafer 1 which has been aligned at the alignment section 14 is subjected to certain processes at the processing section 15. The processing section 15 includes two lines of inside and intermediate load lock chambers 23 and 24, for example, capable of carrying the semiconductor wafer 1 while keeping it airtight into a first processing chamber 22 (which will be described later with reference to FIG. 4) where the etching process is carried out.

A second processing chamber 25 (which will be described later with reference to FIG. 5) is connected to the intermediate load lock chamber 24. The second processing chamber 25 is intended to apply the isotropic etching, resist ashing and the like to the semiconductor wafer 1 which has been processed in the first processing chamber 22. An entrance through which the semiconductor wafer 1 is carried into the inside load lock chamber 23 is formed at that side of the chamber 23 which is located on the side of the alignment section 14, and a system 26a for opening and closing the entrance is arranged at the entrance. Another system 26b for shielding the chamber 23 from the first processing chamber 22 is arranged at that side of the chamber 23 which is opposed to the system 26a.

The inside load lock chamber 23 is provided with a handling arm 27a for transferring the semiconductor wafer 1 from the alignment section 14 to the first processing chamber 22. A system 28a for shielding the intermediate load lock chamber 24 from the first processing chamber 22 is arranged at that side of the chamber 24 which is located on the side of the first processing chamber 22. Another system 28b for shielding the intermediate load lock chamber 24 from the second processing chamber 25 is arranged at that side of the second processing chamber 25 which is located adjacent to the system 28a.

The intermediate load lock chamber 24 is provided with a handling arm 27b for transferring the semiconductor wafer 1 from the first 22 to the second processing chamber 25.

A vacuum discharge system which is a rotary pump, for example, is connected to each of the load lock chambers 23 and 24. A purge system through which inactive gas such as $N_2$ gas can be introduced is connected to each of the load lock chambers 23 and 24.

The first processing chamber 22 is made of aluminium, as shown in FIG. 4. The inner face of the first processing chamber 22 is alumite-processed and shaped like a cylinder. A lower electrode 30 connected to a lift system 29 is located, freely movable up and down, under the first processing chamber 22.

The lower electrode 30 is formed by alumite-processing the surface of a plate made of aluminium, for example. The lower electrode 30 is provided with four through-holes (not shown) extending in the vertical direction of the electrode 30. Cooling gas flow ducts are connected to the through-holes and communicated with openings (not shown) which are formed on the surface of the lower electrode 30. The openings are sixteen in total, for example, and they are formed on that surface of the lower electrode 30 which correspond to the circumferential rim of the semiconductor wafer 1. A cooling gas introducing pipe is arranged at the bottom of the first processing chamber 22 so as to freely supply cooling gas such as helium gas to the underside of the semiconductor wafer 1 through the openings and through-holes of the lower electrode 30. The cooling gas introducing pipe is connected to a cooling gas supply source (not shown).

Exhaust gas in the first processing chamber 22 is discharged outside by an exhaust means through an exhaust pipe 44 connected to one side of the first processing chamber 22. The exhaust means comprises a turbo molecular pump and a rotary pump connected successively to the turbo molecular pump.

An upper electrode 47 is arranged in the first processing chamber 22, opposing to the lower electrode 30. The upper electrode 47 is made by conductive material which is formed by alumite-processing the surface of an aluminium member, for example. The upper electrode 47 is provided with a cooling means.

An upper electrode member 50 made of alphamoth carbon, for example, is located under the upper electrode 47, while being electrically connected to the upper electrode 47. A slight space 51 is formed between the upper electrode member 50 and the upper electrode 47. A gas supply pipe 52 is connected to the space 51. The gas supply pipe 52 is intended to supply reaction and carrier gases from a gas supply source 55 located outside the first processing chamber 22 into the space 51 through a flow rate adjuster (not shown). The flow rate adjuster is a mass flow controller, for example. $CHF_3$, $CF_4$ or the like can be used as the reaction gas. Ar, He or the like can be used as the carrier gas.

The upper electrode member 50 is provided with plural holes 54 through which the reaction gas and the like diffused into the space 51 are allowed to flow into the first processing chamber 22.

A high frequency power source 57 is connected to the upper electrode 47 through a matching circuit (not shown) so a to apply high frequency power to the upper 47 and the lower electrode 30.

Figure 5:
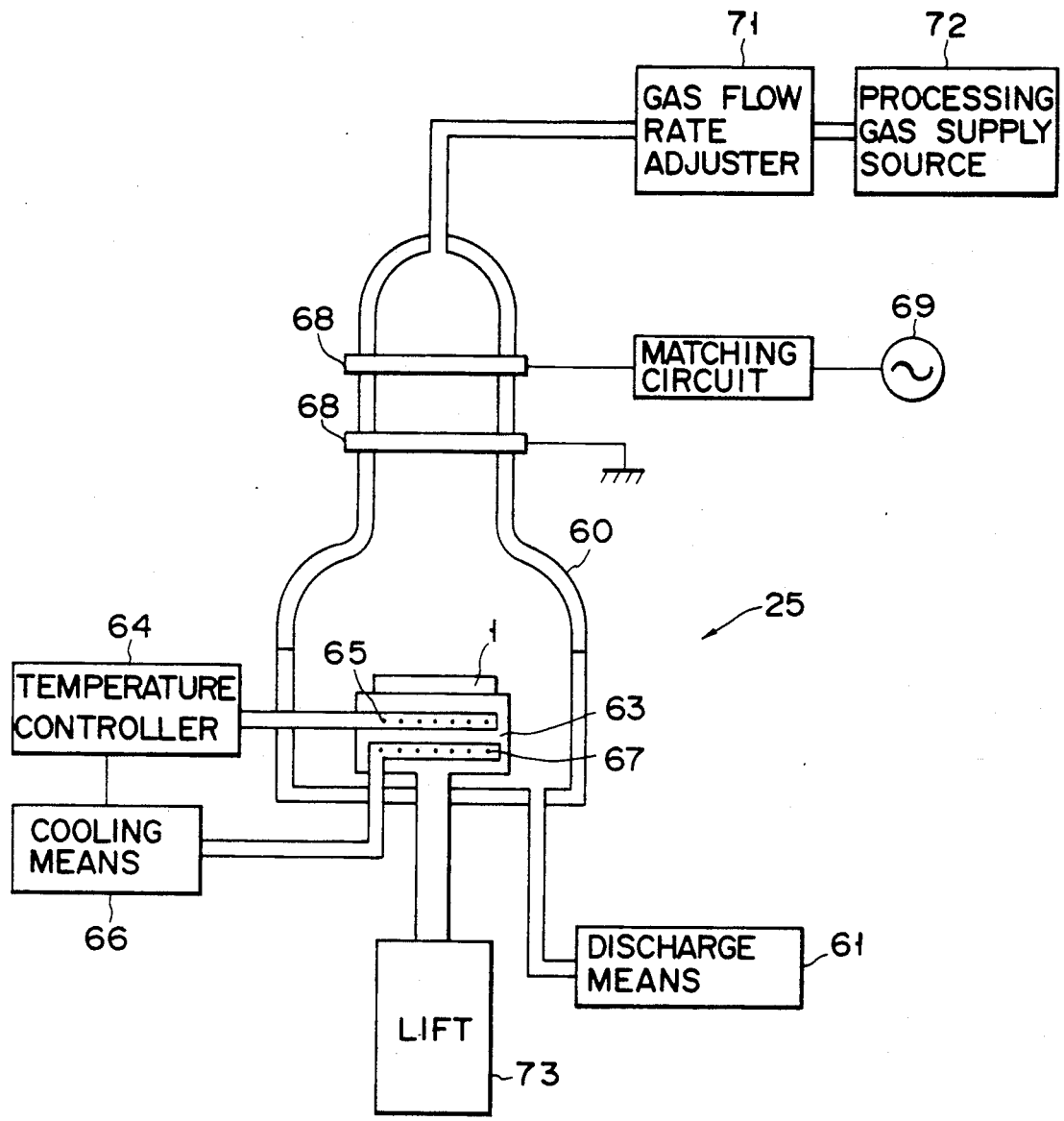
FIG. 5 is intended to explain how a second processing chamber shown in FIG. 3 is arranged.

Two-stepped cylindrical processing vessel 60 is arranged in the second processing chamber 25, as shown in FIG. 5. Electrodes 68 are arranged round the upper cylindrical portion of processing vessel 60. The electrodes 68 are connected to a high frequency power source means 69 which oscillates at 13.56 MHz, for example, through a matching circuit. A stand 63 for sucking and holding the semiconductor wafer 1 by means of a vacuum chuck, for example, is arranged in the processing vessel 60. The temperature of the wafer mounted stand 63 is controlled by a temperature controller 64. More specifically, the wafer mounted stand 63 houses a cooling water circulating pipe 67 which is controlled by a heater 65 and a cooling means 66. The wafer mounted stand 63 is freely moved up and down by a lift 73.

A processing gas supply source 72 is connected to the top of the processing vessel 60 through a gas flow rate adjuster 71. Discharge opening (not shown) is formed at the bottom of the processing vessel 60 so as to flow gas from the center of the wafer mounted stand 63 to the circumference thereof. This gas is introduced to a discharge means 61 through a discharge passage and then to a purge gas supply source (not shown).

The operating section 16 is intended to set the operation of each of the above-described systems and to monitor the state of wafers processed. The operating section 16 comprises a control area (not shown) which includes microcontrollers, a memory area, and an input/output area. The software of C language, for example, is applied to the operating section 16.

It will be described how the substrate processing apparatus having the above-described arrangement is operated at the time of the etching process.

The wafer cassette 17 in which 25 sheets of the semiconductor wafers 1, for example, are housed is mounted on the loading mount 18 by the operator or robot hand. An empty wafer cassette 17 is mounted on the unloading mount 18. The wafer cassette 17 mounted on the loading mount 18 is moved up and down by the lift to set the semiconductor wafer 1 at a predetermined position. The multi-joint robot 19 is moved at the same time to the loading wafer cassette 17 and set at a predetermined position. The arm 20 of the multi-joint robot 19 is put under the desired semiconductor wafer 1.

The mount 18 is moved down by a predetermined distance and the arm 20 of the robot 19 is pulled out of the wafer cassette 17 while supporting the desired semiconductor wafer 1 on the arm 20. The semiconductor wafer 1 supported by the arm 20 is carried and mounted onto the vacuum chuck 21 at the prealignment section 14.

The semiconductor wafer 1 is positioned here on the basis of orientation flat planes formed at the center of the semiconductor wafer 1 and on the side thereof. Inactive gas such as $N_2$ gas has been already introduced and pressurized in the inside load lock chamber 23. The system 26a of the inside load lock chamber 23 is opened while introducing $N_2$ gas into the chamber 23. The semiconductor wafer 1 which has been positioned by the handling arm 27a is carried into the inside load lock chamber 23 and the system 26a is then closed.

Pressure in the inside load lock chamber 23 is reduced to a predetermined value of $1 \times 10^{-4}$ Torr, for example. The system 26b of the inside load lock chamber 23 is opened under this state. The semiconductor wafer 1 is carried into the first processing chamber 22 by the handling arm 27a. As the semiconductor wafer 1 is thus carried into the first processing chamber 22, the lower electrode 30 is driven by the lift 29 and stopped under the state that the semiconductor wafer 1 is mounted on the top of the lower electrode 30. The handling arm 27a is then pulled back in the inside load lock chamber 23 and the system 26b is closed. The lower electrode 30 is lifted by the lift 29 while supporting the semiconductor wafer 1 on the top thereof to set the gap between the lower electrode 30 and the upper electrode member 50 at a value of 6–20 mm, for example.

The first processing chamber 22 is discharge-controlled during the above-described operation of the lower electrode 30 and it is recognized whether or not predetermined gas flow and discharge pressure are kept in the first processing chamber 22. While discharge-controlling the first processing chamber 22 to keep its pressure at a value of 0.1–3 Torr, 100 SCCM of $CHF_3$ gas and 100 SCCM of $CF_4$ gas which are reaction gases, and 100 SCCM of He gas and 100 SCCM of Ar gas which are carrier gases are uniformly introduced from the gas supply source into the space 51 between the upper electrode 47 and the upper electrode member 50 through the gas supply pipe 52. High frequency power having a frequency of 380 KHz, for example, is applied between the upper electrode member 50 and the lower electrode 30 to make the reaction gases plasma-like and this plasma-like reaction gas is used to apply anisotropy etching, for example, to the semiconductor wafer 1.

When this process is finished, the lower electrode 30 is lowered while discharging the reaction gases from the first processing chamber 22, and when pressure in the intermediate load lock chamber 24 is made equal to that in the first processing chamber 22, the system 28a is opened.

The handling arm 27b arranged in the intermediate load lock chamber 24 is inserted into the first processing chamber 22. The semiconductor wafer 1 is carried into the intermediate load lock chamber 24 by the handling arm 27b and the system 28a is closed.

Pressure in each of the second processing chamber 25 and its processing vessel 60 has been reduced equal to that in the intermediate load lock chamber 24. The system 28b is opened and the semiconductor wafer 1 is mounted on the stand 63 of the processing vessel 60 in the second processing chamber 25 by the handling arm 27b. The system 28b is closed.

The semiconductor wafer 1 is sucked and held on the stand 63. The stand 63 is lifted by the lift 73 to set the semiconductor wafer 1 at a predetermined position.

When the semiconductor wafer 1 is mounted on the stand 63, the processing vessel 60 is depressurized to a certain pressure by a pressure discharge means 61. Gas mixture of furon 14 ($CF_4$) and oxygen ($O_2$) which is the etching gas supplied from the processing gas supply source 72 is adjusted in flow rate by the gas flow rate adjuster 71. This gas mixture and the like are introduced into the processing vessel 60 and high frequency power having a frequency of 13.56 MHz, for example, is applied from the high frequency power source 69 to the electrodes 68 at the same time, to thereby make the etching gas plasma-like adjacent to the electrodes 68. The plasma-like etching gas is further supplied to the semiconductor wafer 1 in the processing vessel 60 to apply the isotropic etching to the wafer 1. The temperature of the stand 63 is controlled by cooling water circulating from the cooling means 66 through the piping 67.

When the isotropic etching is finished, purge gas and the like are introduced into the processing vessel 60 to discharge the etching gas outside the processing vessel 60. The resist ashing process follows.

The heater 65 embedded in the stand 63 is controlled by the temperature controller 64 to set the temperature of the stand 63 about 300° C. so as to heat the semiconductor wafer 1.

Oxygen gas whose flow rate is adjusted to be about 300-1500 SCCM by the flow rate adjuster 71 is sent from the processing gas supply source 72 into the processing vessel 60. As seen in the case of the isotropic etching, high frequency power is applied to make a part of the oxygen gas ozonic, and the oxygen gas is caused to flow to the semiconductor wafer 1 as the resist ashing gas which contains ozones.

Gas pressure in the processing vessel 60 is controlled to be in a range of 200-2000 m Torr by the discharge means 61. When the processing vessel 60 is discharged in this manner, the resist ashing gas creates a flow of gas flowing from the center of the semiconductor wafer 1 to the circumference thereof.

Ozones are heated by the heated semiconductor wafer 1 and atmosphere around the wafer 1 and decomposed to generate a large amount of oxygen atom radicals. These oxygen atom radicals react with the photoresist film on the surface of the semiconductor wafer 1, so that the resist ashing is carried out to remove the photoresist film.

The life of ozones created at the electrode area in the upper portion of the processing vessel depends upon temperature and when temperature becomes high, decomposition of ozones is promoted to quickly shorten their life. It is however desirable that the semiconductor wafer 1 at the resist ashing process which is carried out using the oxidation reaction of the oxygen atom radicals created by the decomposition of ozones is heated to about 150°-350° C.

When the etching and the resist ashing are finished in this manner, purge gas is introduced into the processing vessel 60 to make pressure in the vessel equal to that outside the vessel 60 and the system 25a is then opened.

The multi-joint robot 19 is previously moved to a predetermined position and the arm 20 of this robot 19 is inserted into the second processing chamber 25 to suck the semiconductor wafer 1 on the arm 20. The arm 20 is pulled back out of the second processing chamber 25 and the system 25a of the second processing chamber 25 is closed. At the same time, the multi-joint robot 19 is rotated by 180 degrees while being moved to a predetermined position so as to allow the arm 20 to carry and set the semiconductor wafer 1 at a predetermined position in the empty cassette 17.

It should be understood that the present invention is not limited to the above-described embodiment, but when substrates to be processed are damaged, contacting atmosphere between any two processes of treating the substrates, same apparatus as the above-described one can be realized to protect the substrates from atmosphere between these two processes.

Although the etching process section has been located adjacent to the ashing process section and the etching process at first and then the ashing process have been applied to the wafer at these sections while keeping the wafer not contacted with atmosphere, it may be arranged that a processing section is provided with etching and ashing systems and that the etching and ashing processes are carried out at the same time at the processing section.

Instead of semiconductor wafers, LCD substrates used for image display means in the liquid crystal televisions may be used as matters to be processed.

According to the present invention as described above, the etching process and the resist ashing process which follows the etching process can be achieved by a single apparatus without exposing the semiconductor wafers to atmosphere. This can enhance the productivity of semiconductor wafers processed. Further, this makes it possible to efficiently use the space for the apparatus.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A substrate processing apparatus, comprising:
 a housing section for housing a substrate to be processed;

a first chamber including a first capacitive coupling electrode means for an anisotropic etching treatment, said first capacitive coupling electrode means including a pair of mutually facing parallel plate electrodes;

conveyor means for conveying the substrates from said housing section into said first chamber;

a second chamber including a processing vessel for applying an ashing treatment and an isotropic etching treatment to the substrate;

a stage disposed in an inner lower part of said processing vessel for supporting the substrate; and a second capacitive coupling electrode means for generating plasma within the processing vessel;

wherein said second capacitive coupling electrode means includes a pair of ring shaped electrodes disposed in an upper outside region of the processing vessel so as not to be exposed to the plasma generated within the processing vessel, and the inner diameter of the processing vessel in the region at which the pair of ring shaped electrodes are disposed is smaller than that in the region at which said stage is disposed.

2. The substrate processing apparatus according to claim 1, wherein said conveyor means is a multi-joint robot for conveying the substrates among the housing, alignment and processing sections.

3. The substrate processing apparatus according to claim 2, wherein said multi-joint robot is provided with an arm having a holder system which is a vacuum suction system.

4. The apparatus according to claim 1, wherein said processing vessel is made of glass.

5. The substrate processing apparatus according to claim 1, wherein the small diameter portion in the upper region of the processing vessel is coaxial with the large diameter portion in the lower region of the processing vessel.

6. The substrate processing apparatus according to claim 1, wherein the inner surfaces of the upper and lower regions of the processing vessel are smooth and form a continuous plane.

7. The substrate processing apparatus according to claim 1, further comprising vertical driving means for vertically driving said stage within the processing vessel.

8. The substrate processing apparatus according to claim 1, further comprising an intermediate chamber disposed between the first and second chambers, the atmosphere within said intermediate chamber being inert, and a substrate transfer means being disposed within said intermediate chamber.

9. The substrate processing apparatus according to claim 1, further comprising temperature control means for controlling the temperature of the stage within the processing chamber.

10. The substrate processing apparatus according to claim 9, wherein said temperature control means utilizes, in combination, a heater for heating the stage and a water cooling system for cooling the stage.

11. The substrate processing apparatus according to claim 1, wherein an inlet port for a process gas is formed in the small diameter portion in the upper region of the processing vessel.

* * * * *